United States Patent
Honary et al.

(10) Patent No.: US 7,159,169 B2
(45) Date of Patent: Jan. 2, 2007

(54) APPARATUS AND METHODS FOR FORWARD ERROR CORRECTION DECODING

(75) Inventors: Hooman Honary, Newport Coast, CA (US); Kumar Ganapathy, Palo Alto, CA (US); Amit R. Gupta, Los Altos, CA (US); Siva Simanapalli, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 439 days.

(21) Appl. No.: 10/660,361

(22) Filed: Sep. 11, 2003

(65) Prior Publication Data

US 2005/0060632 A1 Mar. 17, 2005

(51) Int. Cl.
*H03M 13/03* (2006.01)
(52) U.S. Cl. ..................................... 714/795
(58) Field of Classification Search ................. 714/786
See application file for complete search history.

(56) References Cited

U.S. PATENT DOCUMENTS 6,577,678 B1 *  6/2003 Scheuermann .............. 375/222
2002/0119803 A1 *  8/2002 Bitterlich et al. ........... 455/552
2003/0154357 A1 *  8/2003 Master et al. ................ 712/15
2004/0015773 A1 *  1/2004 D'Arcy et al. ............... 714/86
2004/0243908 A1 * 12/2004 Box et al. .................... 714/759
2004/0255230 A1 * 12/2004 Chen et al. .................. 715/796
2005/0010854 A1 *  1/2005 Bickerstaff .................. 714/794
2005/0034051 A1 *  2/2005 Chun et al. .................. 714/795
2005/0044327 A1 *  2/2005 Howard et al. ............. 711/147
2005/0278603 A1 * 12/2005 Berens et al. ................ 714/755

OTHER PUBLICATIONS

Wicker et al. Turbo Coding, Kluwer Academic Publishers, 1999, p. 7.*

* cited by examiner

*Primary Examiner*—Albert Decady
*Assistant Examiner*—Sam Rizk
(74) *Attorney, Agent, or Firm*—Buckley, Maschoff & Talwalkar LLC

(57) ABSTRACT

An apparatus includes an instruction decoder, at least one control register coupled to the instruction decoder, and an add-compare-select (ACS) engine coupled to the at least one control register. The instruction decoder is operative to control the ACS engine to perform Viterbi decoding in response to the instruction decoder receiving a first instruction, and is operative to control the ACS engine to perform turbo decoding in response to the instruction decoder receiving a second instruction.

14 Claims, 4 Drawing Sheets

APPARATUS AND METHODS FOR FORWARD ERROR CORRECTION DECODING

BACKGROUND

Forward error correction (FEC) coding is frequently employed to effectively improve the signal-to-noise ratio of a data transmission channel. Convolutional coding and turbo coding are two well-known types of forward error correction coding. Convolutional coding is sometimes used for encoding voice data for mobile telephone applications. Turbo coding is sometimes used for encoding image data to be transmitted in a mobile application.

It is sometimes desirable for a device to have capabilities for both Viterbi forward error correction decoding (used to decode convolutional encoded data) and turbo forward error correction decoding. This may be done by providing respective processing blocks for Viterbi and turbo decoding, but at the cost of hardware complexity and processing inefficiency.

DETAILED DESCRIPTION

Figure 1:
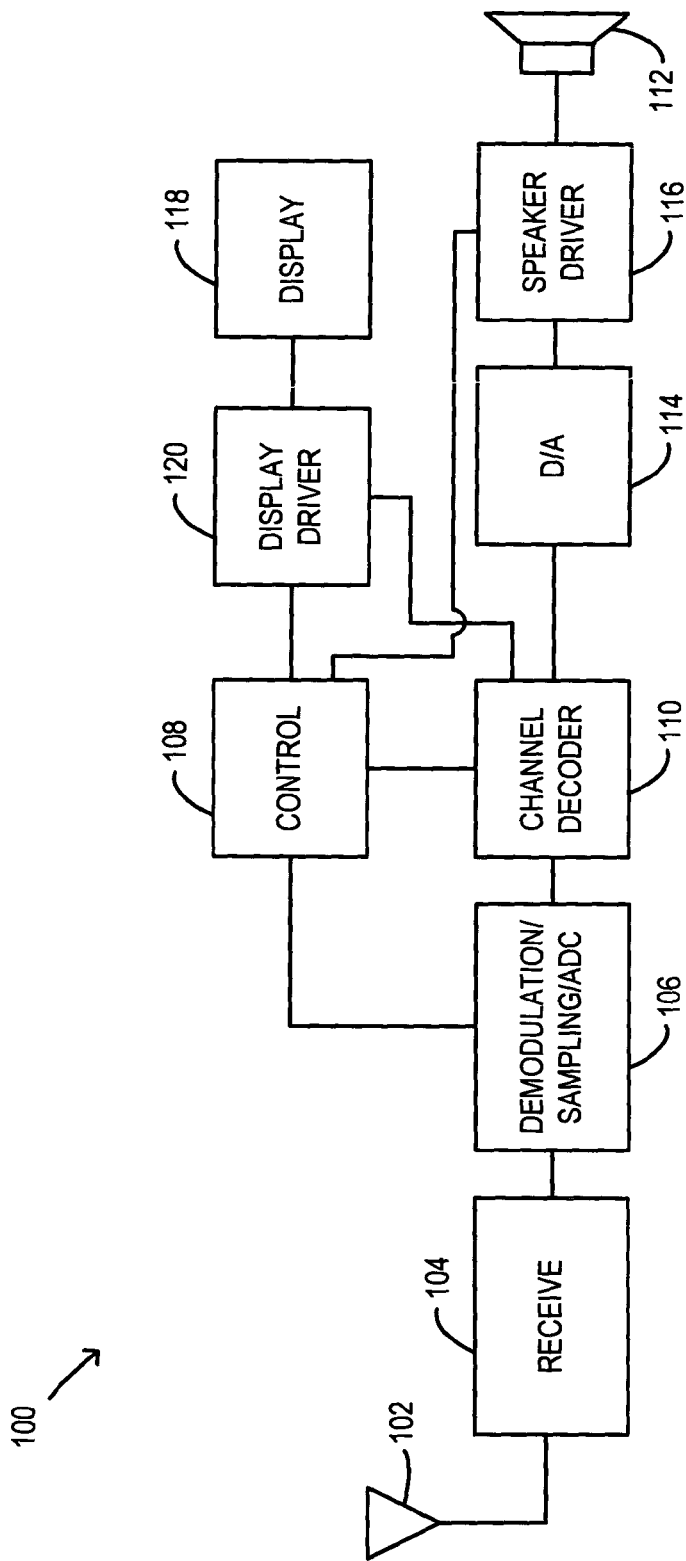
FIG. 1 is a block diagram of signal receiving portions of a cellular telephone according to some embodiments.

FIG. 1 is a block diagram of receive portions of a cellular telephone 100 according to some embodiments (at least some transmit portions, operator controls and other portions of the cellular telephone 100 are omitted to simplify the drawing).

The cellular telephone 100 includes an antenna 102 which is capable of receiving signals transmitted to the cellular telephone 100 from a cellular telephone network (not shown). The cellular telephone 100 also includes receive circuitry 104 which is coupled to the antenna 102 to receive and amplify signals received at the antenna 102. The cellular telephone 100 further includes a demodulation/sampling/analog-to-digital-conversion (ADC) block 106 which is coupled to the receive circuitry 104. The demodulation/sampling/ADC block 106 is capable of demodulating and sampling the received signal to output an encoded digital data signal that represents an encoded signal that was transmitted by the cellular telephone network.

Also included in the cellular telephone 100 is control circuitry 108 which is coupled to the demodulation/sampling/ADC block. The control circuitry 108 may receive control signals transmitted to the cellular telephone 100 from the cellular telephone network and may control overall operation of the cellular telephone 100, including portions of the cellular telephone 100 that are not shown in the drawing. The control circuitry 108 may be constituted, for example, by some or all of an application specific integrated circuit (ASIC) and/or by a conventional microprocessor or microcontroller.

The cellular telephone 100 further includes a channel decoder (forward error correction decoder) 110 which is coupled to the demodulation/sampling/ADC block 106 and to the control circuitry 108. The channel decoder 110 is provided to decode a forward error correction encoded signal output from the demodulation/sampling/ADC block 106. As will be seen, the channel decoder 110 is capable of performing both Viterbi forward error correction decoding and turbo forward error correction decoding.

Also included in the cellular telephone 100 is a speaker 112 that is coupled to the channel decoder 110 via a digital-to-analog converter 114 and speaker driver circuitry 116. The speaker 112 is capable of audibly reproducing corrected voice data output from the channel decoder 110. The speaker driver circuitry 116 may be coupled to the control circuitry 108 to receive control signals from the control circuitry 108.

The cellular telephone 100 also includes a display 118 that is coupled to the channel decoder 110 via display driver circuitry 120. The display 118 is capable of displaying corrected image data output from the channel decoder 110. The display driver circuitry 120 may be coupled to the control circuitry 108 to receive control signals from the control circuitry 108.

Figure 2:
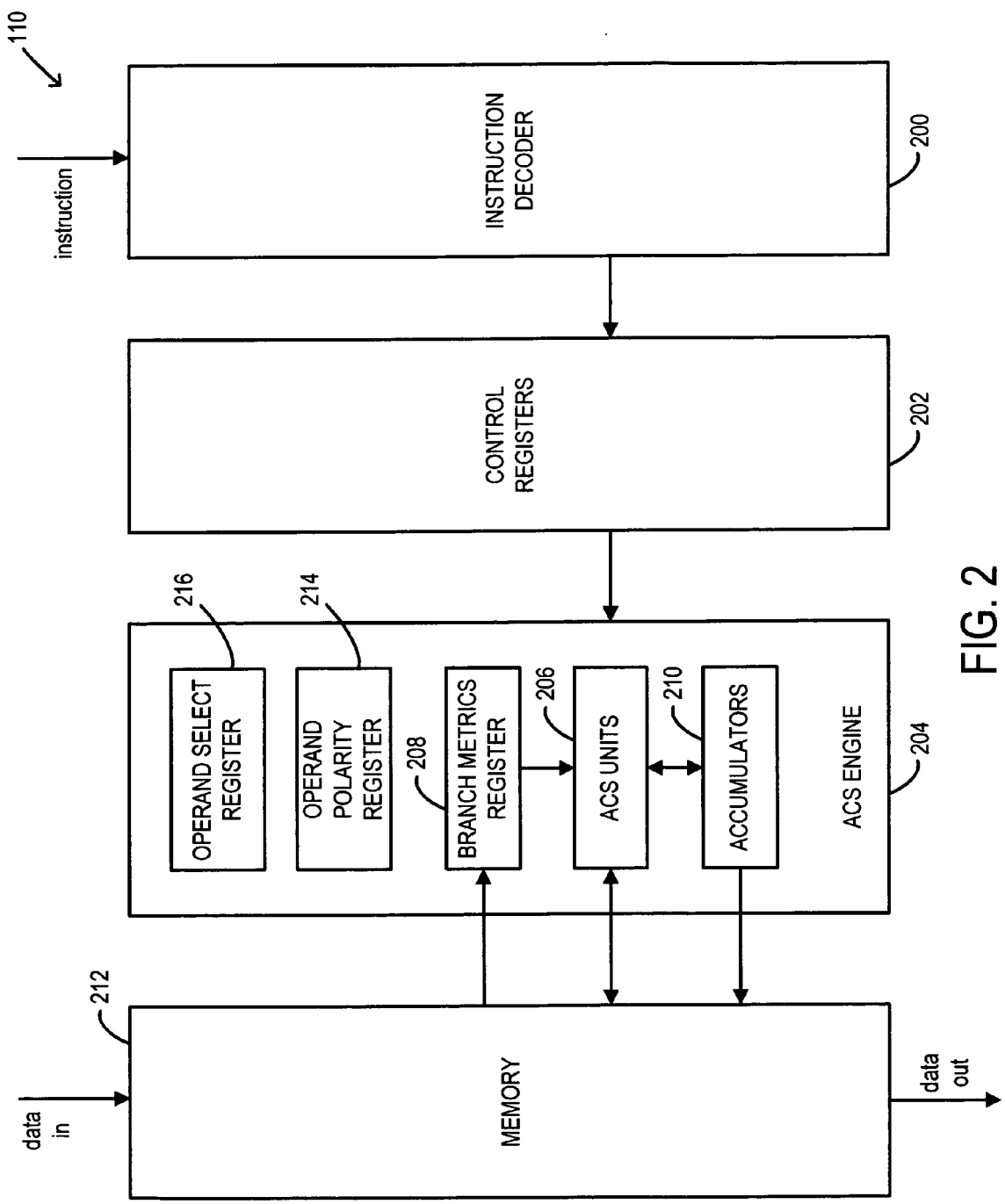
FIG. 2 is a block diagram showing at least a part of a channel decoder block included in the cellular telephone of FIG. 1.

FIG. 2 is a block diagram that shows at least some aspects of the channel decoder 110.

The channel decoder 110 includes an instruction decoder 200. The instruction decoder is capable of decoding and implementing add-compare-select (ACS) instructions defined with a "-viterbi" option and with a "-turbo" option. (An ACS instruction with the "-viterbi" option will hereinafter sometimes be referred to as a "Viterbi instruction" or a "Viterbi decode instruction". An ACS instruction with the "-turbo" option will hereinafter sometimes be referred to as a "turbo instruction" or a "turbo decode instruction".)

The channel decoder 110 may also include control registers 202 (or at least one control register) which are coupled to and controlled by the instruction decoder 200. The channel decoder 110 further includes an ACS engine 204 which is coupled to the control registers 202. The manner in which the ACS engine 204 operates at any given time may be determined by signals currently stored in the control registers 202 by the instruction decoder 200. In some embodiments, the instruction decoder 200 responds to a Viterbi instruction by controlling the ACS engine 204 (via the control registers 202) to perform Viterbi decoding, and the instruction decoder 200 responds to a turbo instruction by controlling the ACS engine 204 (via the control registers 202) to perform turbo decoding. When the ACS engine 204 is operated to perform turbo decoding, it performs ACS operations in the logarithm domain to carry out multiply-compare-select operations required for turbo decoding. Other differences between operation of the ACS engine 204 for Viterbi decoding and operation of the ACS engine 204 for turbo decoding will be described below.

The ACS engine 204 includes a plurality of ACS units, represented by block 206 in FIG. 2. The ACS units perform ACS operations. In some embodiments, the ACS engine 204 includes eight ACS units 206. The ACS engine 204 also includes a branch metrics register 208 which is coupled to the ACS units 206 to supply branch metric data to the ACS units 206. The ACS engine 204 further includes accumulators (represented by block 210) which are coupled to the ACS units 206 to store results of the ACS operations performed by the ACS units 206. In connection with some modes of operation of the ACS engine 204, at least some of the accumulators 210 may also serve as sources of operands for the ACS units 206. In some embodiments, the ACS engine 204 includes four or six accumulators 210 and each accumulator may be constituted by eight accumulator units (not separately shown). In some embodiments, each accumulator unit may be capable of storing 48 bits, including 16 guard bits to allow for an appropriate degree of precision during calculation operations.

The channel decoder 110 may also be considered to include a memory 212, which may be shared with the control circuitry 108 (FIG. 1) and/or with other components of the cellular telephone 100. The memory 212 may be coupled to each of the branch metrics register 208, the ACS units 206 and the accumulators 210.

The following are examples of Viterbi instructions that may be defined according to some embodiments:

(1) Acs-viterbi-rate [½|⅓|¼] da1, da2, da3, da4, mx, my, sz, bmr, [ps0, ps1];

(2) Acs-viterbi-rate [½|⅓|¼] da1, da2, da3, da4, da5, da6, sa1, sa2, sz, bmr, [ps0, ps1].

Instruction (1) may be used for decoding data having a relatively high number of states (e.g., 128 or 256 or more states), and calls for direct memory access (operands mx, my are memory locations) for updating path metrics. Instruction (2) may be used for decoding data having a relatively low number of states (e.g., 64 states or less), and calls for updating path metrics in accumulators, thereby reducing overall memory bandwidth requirements. Thus in some embodiments, path metrics can be updated from/to memory or from/to accumulators.

The operands sx, sy may support eight 16-bit words, corresponding to 16-bit old path metrics.

The operand sz corresponds to a control register and carries operand polarity register (OPR—reference numeral 214. FIG. 2) and operand select register (OSR—reference numeral 216) bits. When the data to be decoded is at rate ½, one bit each of OPR and OSR is needed for each butterfly operation. When the data to be decoded is at rate ⅓, two bits each of OPR and OSR are needed for each butterfly operation. When the data to be decoded is at rate ¼, three bits each of OPR and OSR are needed for each butterfly operation.

The bmr operand is stored in the special purpose branch metrics register 208. When the data to be decoded is at rate ½, two 16-bit branch metrics are stored in the branch metrics register 208. When the data to be decoded is at rate ⅓, four 16-bit branch metrics are stored in the branch metrics register 208. When the data to be decoded is at rate ¼, eight 16-bit branch metrics are stored in the branch metrics register 208.

The operands da1, da2 (destination accumulator 1, destination accumulator 2) contain the new path metrics correctly ordered and de-interleaved.

The operands da3, da4 (destination accumulator 3, destination accumulator 4). contain the updated trace-back bits, in the case of Instruction (1), where a source operand is supplied from memory. Viterbi decoding using source operands from memory may be used in some embodiments in connection with the WCDMA (wideband code division multiple access) mobile communication protocol among others. In the case of Instruction (2), where accumulators provide the source operands, da3 and da4 contain the same new path metrics as da1, da2, but ordered in a way to act as a source for the next Viterbi operation. Viterbi decoding using source operands only from accumulators may be used in some embodiments only in connection with communication protocols other than WCDMA.

The operand ps0 writes the contents of da1 to memory.

The operand ps1 writes the contents of da2 to memory.

Instructions (1) and (2) may also support an option "-tr", which specifies the destination column and bit positions for trace-back bits in da3 and da4

The operands sa1, sa2 (source accumulator 1, source accumulator 2) may each contain eight 16-bit old path metrics.

The operands da5, da6 (destination accumulator 5, destination accumulator 6) contain trace-back bits.

In some embodiments, the same accumulator 210 may be used for da3 and sa1, and the same accumulator 210 may be used for da4 and sa2.

The following is an example of a turbo instruction that may be defined according to some embodiments:

(3) Acs-turbo-dual da1, da2, da3, da4, sa1, sa2, sz, bmr, 1utr [ps0, ps1].

The operand mx corresponds to eight 16-bit state metrics fetched on a bus from memory.

The operand sa1 contains 4 old 16-bit state metrics that correspond respectively to even-numbered ACS units.

The operand sa2 contains 4 old 16 bit state metrics that correspond respectively to odd-numbered ACS units.

As before, operand sz contains OPR and OSR bits, and may correspond either to a general purpose register or a code bus.

The bmr operand again corresponds to branch metrics to be stored in the branch metrics register 208. For all turbo decoding only two of eight entries are used. The entries are indexed by OSR bits.

The 1utr operand is a 16 entry look up table. Each entry is four bits. All 16 entries are used.

Operand da1 contains the updated four 16-bit state metrics to be written to memory, corresponding to the first four ACS units.

Operand da2 contains the updated four 16-bit state metrics to be written to memory, corresponding to the second four ACS units.

Operand da3 contains the updated four 16-bit state metrics corresponding to the even-numbered ACS units.

Operand da4 contains the updated four 16-bit state metrics corresponding to the odd-numbered ACS units.

Operand ps0 writes da3 to memory.

Operand ps1 writes da4 to memory.

In operation, a signal may be received via the antenna 102 (FIG. 1) and the receive circuitry 104. The received signal may be demodulated, sampled and analog-to-digital converted at the demodulation/sampling/ADC block 106 to provide an input signal for the channel decoder 110. The demodulated signal may also include control parameters that may be provided to the control circuitry 108 to indicate how the received signal was encoded for forward error correction at the source of the signal.

Figure 3:
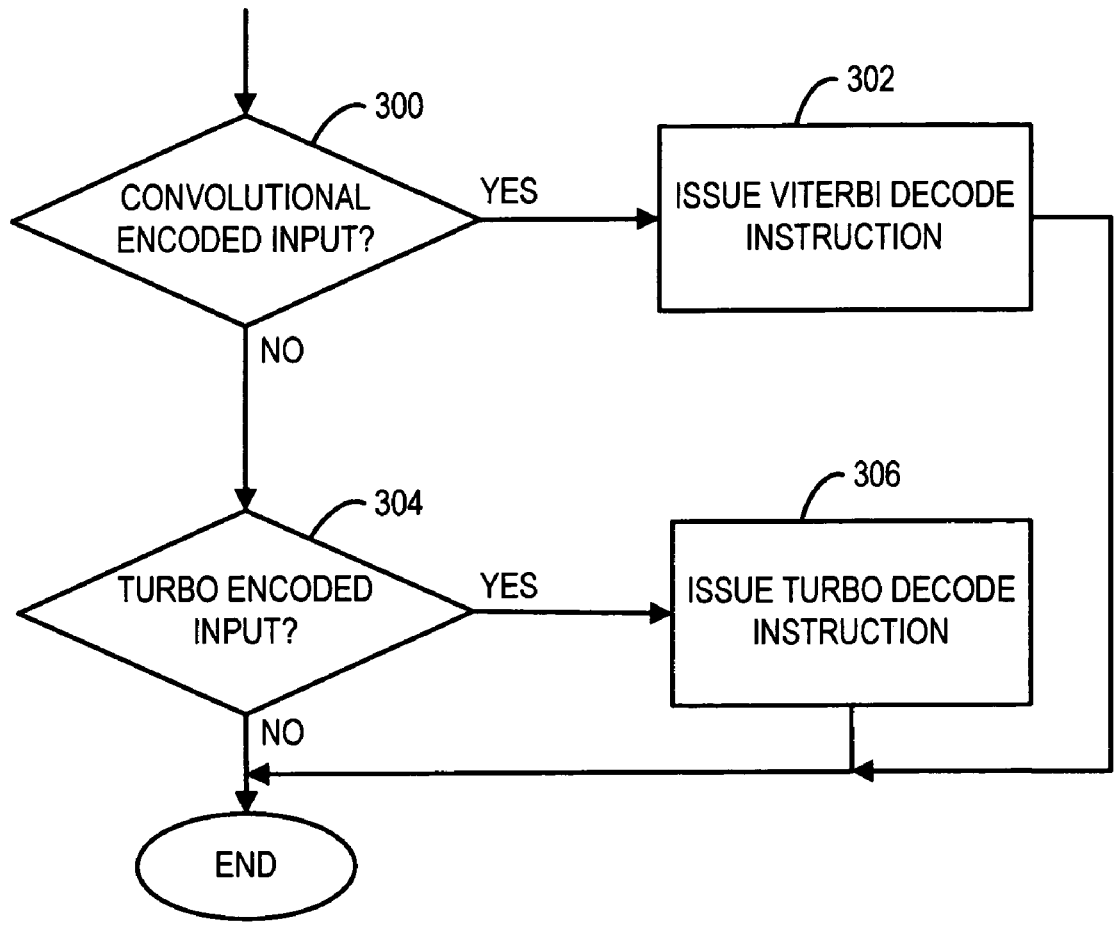
FIG. 3 is a flow chart that illustrates a process performed by a control circuit included in the cellular telephone of FIG. 1.

The control circuitry 108 may perform a process as depicted in FIG. 3 to determine whether to issue a viterbi decode instruction or a turbo decode instruction. At 300 in FIG. 3 it is determined whether the signal received via the antenna 102 and the receive circuitry 104 includes convolutional encoded data. If so, then as indicated at 302 the control circuitry 108 issues a viterbi decode instruction (e.g., Instruction (1) or Instruction (2), depending on the number of states of the input data) to the instruction decoder 200 of the channel decoder 110.

If it is not determined at 300 that the input signal includes convolutional encoded data, then it is determined, at 304, wheither the input signal includes turbo encoded data. If so, then as indicated at 306 the control circuitry 108 issues a turbo decode instruction (e.g., Instruction (3)) to the instruction decoder 200.

In some embodiments, convolutional encoding may be utilized for forward error correction encoding of voice data, and turbo encoding may be utilized for forward error correction encoding of image data.

Figure 4:
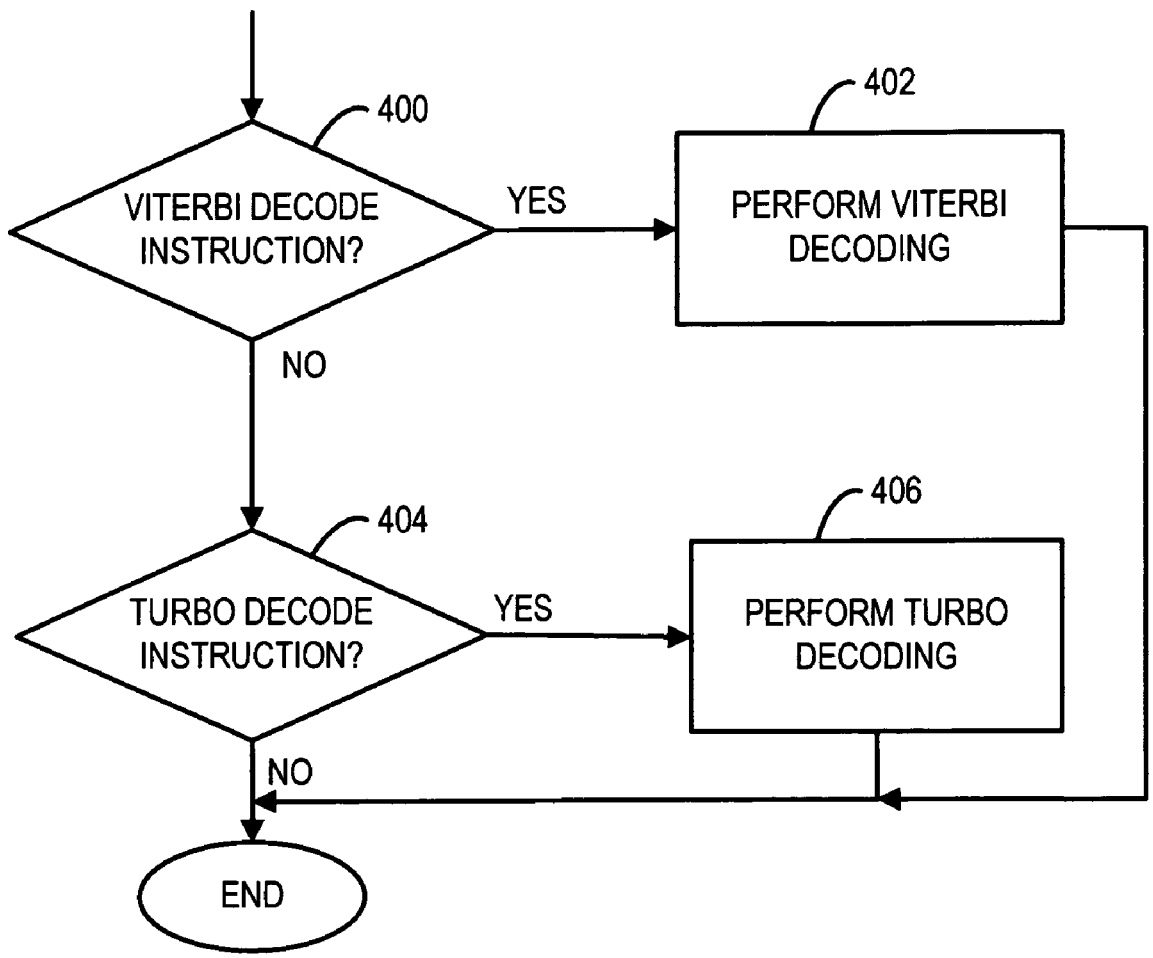
FIG. 4 is a flow chart that illustrates a process performed in the channel decoder of FIG. 2.

The channel decoder 110 (FIGS. 1 and 2) may perform a process as depicted in FIG. 4 to determine whether to perform Viterbi decoding or turbo decoding. At 400 in FIG. 4 it is determined whether a Viterbi decode instruction (e.g., like Instruction (1) or Instruction (2)) has been received at the instruction decoder 200 (FIG. 2) of the channel decoder 110. If so, then as indicated at 402 the instruction decoder 200 controls the ACS engine 204, via the control registers 202, so that Viterbi decoding is performed in the channel decoder 110.

If it is not determined at 400 that a Viterbi decode instruction has been received at the instruction decoder 200, then it is determined at 404 whether a turbo decode instruction (e.g., like Instruction (3)) has been received at the instruction decoder 200. If so, then as indicated at 406 the instruction decoder controls the ACS engine 204, via the control registers 202, so that turbo decoding is performed in the channel decoder 110.

When Viterbi decoding is performed in the channel decoder 110, the ACS engine 204 (FIG. 2) performs eight 16-bit butterfly operations per cycle. This is true for each of rates ½, ⅓ and ¼. Each of the eight butterfly operations is handled by a respective one of the eight ACS units 206. Each butterfly operation takes as inputs two state metrics, two or four 16-bit branch metrics, one bit to determine branch polarity (OPR) and one or two bits to select the appropriate branch metric (OSR). The butterfly operation includes computation of two new state metrics and two bits of trace-back information. Results of adding portions of the butterfly operation are compared and the minimum result is chosen as the surviving path, indicated by the trace-back information.

When turbo decoding is performed in the channel decoder 110, the ACS engine 204 performs four 16-bit butterfly operations when operating in a single mode or eight 16-bit butterfly operations when operating in a dual mode. The ACS operation is performed in the logarithmic domain to accomplish a multiply-compare-select operation required for turbo decoding.

During turbo decoding, each ACS unit 206 receives as inputs two 16-bit state metrics, two 16-bit branch metrics, one OPR bit to determine branch polarity and one OSR bit to select the appropriate branch metric.

In performing turbo decoding, the butterfly operations do not produce trace-back bits. Also, the final add of the butterfly operation during turbo decoding may be a three-operand add, rather than the two-operand add performed during Viterbi decoding. The third operand for the final turbo decoding add represents a log correction term and is looked up in a look up table (stored in sa2 and sa3) when the 12 high order bits of an intermediate result obtained from a first adder of the final add are all 1's or all 0's. When this is the case, the four low order bits are used to index the look up table.

In some embodiments, the channel decoder 110 is arranged to decode turbo encoded data only at rate ½ (in addition to the Viterbi decoding described above).

If the data that is forward error correction decoded by the channel decoder 110 is voice data, then the decoded (corrected) data from the channel decoder 110 is converted to an analog voice signal at the digital-to-analog converter 114 and the resulting analog signal is used by the speaker driver 116 to cause the speaker 112 to audibly reproduce the corrected input signal.

If the data that is forward error correction decoded by the channel decoder 110 is image data, then the decoded data from the channel decoder 110 is supplied to the display driver 120, which causes the display 118 to display images corresponding to the corrected input signal.

In embodiments described above, the same ACS hardware is used for both Viterbi decoding and turbo decoding, which may allow the hardware design of the channel decoder to be streamlined and may promote processing efficiency by allowing tight integration of FEC decoding with the main dataflow.

In embodiments described above the channel decoder which utilizes the same ACS engine for both Viterbi and turbo decoding was presented as a component of a cellular telephone. Alternatively, such a channel decoder may be used in other types of devices, including mobile telephone base station equipment and satellite earth stations.

In the processes described above the order in which the elements of the processes are performed may be changed, and the elements may be performed in any order that is practical.

Thus, in some embodiments, an apparatus may include an instruction decoder, at least one control register coupled to the instruction decoder and an add-compare-select (ACS) engine coupled to the at least one control register. The instruction decoder may be operative to control the ACS engine to perform Viterbi decoding in response to the instruction decoder receiving a first instruction, and may further be operative to control the ACS engine to perform turbo decoding in response to the instruction decoder receiving a second instruction.

In some other embodiments, a method may include providing a forward error correction decoder which includes an instruction decoder, operating the forward error correction decoder to perform Viterbi decoding if the instruction decoder receives a first instruction, and operating the forward error correction decoder to perform turbo decoding if the instruction decoder receives a second instruction.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
an instruction decoder;
at least one control register coupled to the instruction decoder;
an add-compare-select (ACS) engine coupled to the at least one control register, said ACS engine including;
a plurality of ACS units to perform ACS operations;
a branch metric register coupled to the ACS units to supply branch metric data to the ACS units; and
a plurality of accumulators coupled to the ACS units to store results of the ACS operations performed by the ACS units; and
a memory coupled to the ACS units, to the branch metric register, and to the accumulators;
wherein the instruction decoder is operative to control the ACS engine to perform a first Viterbi decoding mode in response to the instruction decoder receiving a first instruction, the instruction decoder is further operative to control the ACS engine to perform a second Viterbi decoding mode different from the first Viterbi decoding mode in response to the instruction decoder receiving a second instruction, and the instruction decoder is further operative to control the ACS engine to perform turbo decoding in response to the instruction decoder receiving a third instruction; and wherein in the first Viterbi decoding mode path metrics are updated from the accumulators and in the second Viterbi decoding mode path metrics are updated from the memory.

2. The apparatus of claim 1 wherein the plurality of accumulators includes four accumulators.

3. The apparatus of claim 2 wherein each of the accumulators includes eight units, each unit being capable of storing 48 bits.

4. The apparatus of claim 3 wherein the 48 bits stored in each accumulator unit include 16 guard bits.

5. The apparatus of claim 1 wherein each of the ACS units is capable of performing butterfly operations.

6. The apparatus of claim 5 wherein:

a final add of a butterfly operation performed by one of the ACS units is a two-operand add if the ACS engine is performing Viterbi decoding; and the final add of the butterfly operation is a three-operand add if (a) the ACS engine is performing turbo decoding and (b) a certain intermediate result is obtained during the final add.

7. The apparatus of claim 6 wherein an operand for the three-operand add is looked up in a look up table if (a) the ACS engine is performing turbo decoding and (b) the certain intermediate result is obtained during the final add.

8. A system comprising:

a forward error correction decoder; and a speaker coupled to the forward error correction decoder to audibly reproduce corrected data output from the forward error correction decoder;

wherein the forward error correction decoder includes;

an instruction decoder;

at least one control register coupled to the instruction decoder;

an add-compare-select (ACS) engine coupled to the at least one control register, said ACS engine including:

a plurality of ACS units to perform ACS operations;

a branch metric register coupled to the ACS units to supply branch metric data to the ACS units; and a plurality of accumulators coupled to the ACS units to store results of the ACS operations performed by the ACS units; and a memory coupled to the ACS units, to the branch metric register, and to the accumulators;

wherein the instruction decoder is operative to control the ACS engine to perform a first Viterbi decoding mode in response to the instruction decoder receiving a first instruction, the instruction decoder is further operative to control the ACS engine to perform a second Viterbi decoding mode different from the first Viterbi decoding mode in response to the instruction decoder receiving a second instruction, and the instruction decoder is further operative to control the ACS engine to perform turbo decoding in response to the instruction decoder receiving a third instruction; and wherein in the first Viterbi decoding mode path metrics are updated from the accumulators and in the second Viterbi decoding mode path metrics are updated from the memory.

9. The system of claim 8 wherein the plurality of accumulators includes four accumulators.

10. The system of claim 9 wherein each of the accumulators includes eight units, each unit being capable of storing 48 bits.

11. The system of claim 10 wherein the 48 bits stored in each accumulator unit include 16 guard bits.

12. The system of claim 8 wherein each of the ACS units is capable of performing butterfly operations.

13. The system of claim 12 wherein:

a final add of a butterfly operation performed by one of the ACS units is a two-operand add if the ACS engine is performing Viterbi decoding; and the final add of the butterfly operation is a three-operand add if (a) the ACS engine is performing turbo decoding and (b) a certain intermediate result is obtained during the final add.

14. The system of claim 13 wherein an operand for the three-operand add is looked up in a look up table if (a) the ACS engine is performing turbo decoding and (b) the certain intermediate result is obtained during the final add.

* * * * *